United States Patent [19]

Gray

[11] Patent Number: 4,827,123
[45] Date of Patent: May 2, 1989

[54] DIRECTION SENSITIVE OPTICAL SHAFT ENCODER

[75] Inventor: Donald E. Gray, Snellville, Ga.

[73] Assignee: Sangamo Weston, Inc., Norcross, Ga.

[21] Appl. No.: 268,615

[22] Filed: Nov. 7, 1988

Related U.S. Application Data

[63] Continuation of Ser. No. 850,319, Apr. 11, 1986, abandoned.

[51] Int. Cl.$^4$ .............................................. G01D 5/34
[52] U.S. Cl. .................. 250/231 SE; 341/13
[58] Field of Search ............ 250/231 SE, 237 G; 356/395; 33/125 C; 341/13, 97; 324/175

[56] References Cited

U.S. PATENT DOCUMENTS

| | | | |
|---|---|---|---|
| 2,995,705 | 8/1961 | Walker et al. | 250/237 G |
| 3,058,001 | 10/1962 | Dertouzos | 250/231 SE |
| 3,912,926 | 10/1975 | Coulbourn | 250/237 G |
| 4,621,256 | 11/1986 | Rusk | 324/175 |
| 4,670,737 | 6/1987 | Rilling | 250/231 SE |

OTHER PUBLICATIONS

Les Capteurs en Instrumentation Industrielle, 1982, pp. 352-354.

Primary Examiner—Edward P. Westin
Assistant Examiner—Khaled Shami
Attorney, Agent, or Firm—Sanford J. Asman

[57] ABSTRACT

A direction sensitive optical shaft encoder includes an optical shutter disk mounted to a shaft for rotation therewith, the optical shutter disk bearing at least first and second radially concentric tracks having alternating light transmissive and light blocking areas formed thereon. The light transmissive and light blocking areas of one track are angularly offset with respect to the light transmissive and light blocking areas of an adjacent track. A pair of light emitters and light detectors are disposed on opposite sides of the optical shutter disk and aligned with the first and second concentric tracks, respectively. Because the pattern of light transmissive and light blocking areas on the two tracks are angularly offset, the output of the light detectors follows a unique pattern which is dependent upon the direction of rotation of the optical shutter. The frequency of repetition of the pattern of outputs by the light detectors is indicative of the speed of rotation of the optical shutter. A suitably programmed microprocessor can be used to detect the frequency and pattern of outputs of the light detectors to determine the angular speed of rotation of the optical shutter and its direction of rotation. If the pattern of detector outputs does not follow an expected pattern an alarm condition is generated indicative of a failure of one of the light emitters and/or light detectors or possible tampering with the optical shutter. The optical shutter may be used, for example, to determine the angular speed and direction of rotation of the eddy disk of an electricity meter.

4 Claims, 1 Drawing Sheet

U.S. Patent
May 2, 1989
4,827,123
FIG. 1
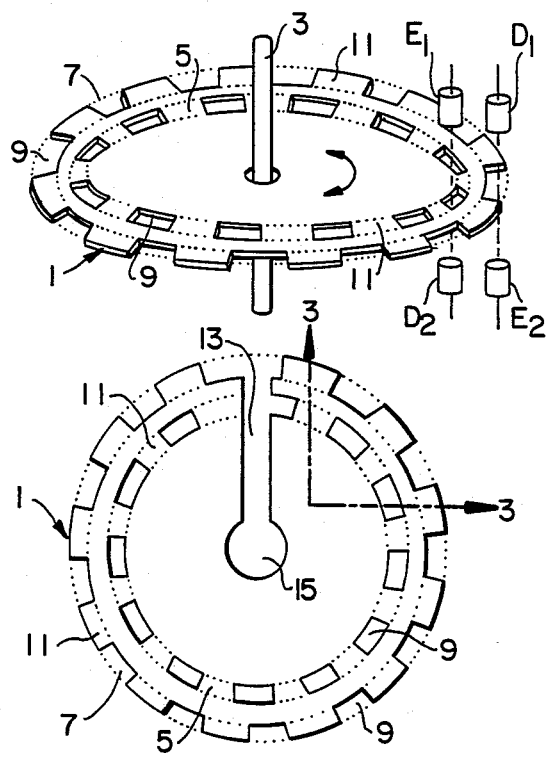
FIG. 2
FIG. 3
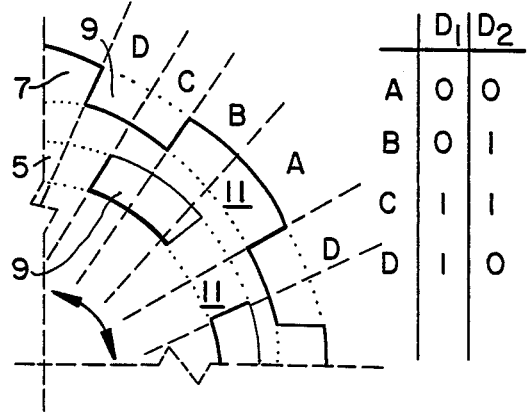
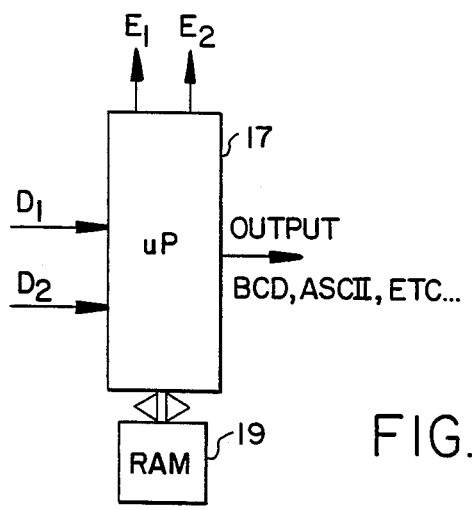
FIG. 4

DIRECTION SENSITIVE OPTICAL SHAFT ENCODER

This application is a continuation of applicaton Ser. No. 850,319 filed on Apr. 11, 1986, entitled DIRECTION SENSITIVE OPTICAL SHAFT ENCODER, now abandoned.

TECHNICAL FIELD

The invention relates to the field of optical shaft encoders and, more particularly, to an optical shaft encoder which indicates both the angular speed of rotation and direction of rotation of a shaft.

BACKGROUND ART

Optical shaft encoders are well known for their use in determining the angular position of a rotating shaft. Such optical shaft encoders are used in various types of machinery and machine tools where information concerning the precise angular relationship or speed between a shaft and another component is needed.

Optical shaft encoders generally consist of an optical shutter, such as a disk or drum, which is rigidly attached to a shaft whose position or speed of rotation is to be determined. The optical shutter is used to modulate the transmission of light between a light emitter (e.g. a light emitting diode) and a light detector (e.g. a photodiode or phototransistor). This modulation may be transmissive, in which case the optical shutter has a pattern of slots formed on its surface and the light emitter and light detector are arranged on opposite sides of the optical shutter.

In most such arrangements, the output of the light detector produces a series of pulses indicative of the passage of the slots borne by the optical shutter past the light emitter and light detector due to rotation of the optical shutter. The frequency of these pulses is indicative of the angular speed of rotation of the optical shutter and its associated shaft.

In some environments it is desirable to know not only the angular speed of rotation of the optical shutter and shaft but also the direction of rotation. For example, in an electricity meter, such as a watthour meter or a demand meter, the direction of rotation of the eddy disk of the meter depends upon the direction of power flow through the meter. In such meters, it is common to use a so-called pulse initiator to detect the motion of the eddy disk due to power flow. In one common type of pulse initiator, a simple pattern of light and dark areas are formed on a single concentric track around the rim of the eddy disk. A light source and light detector are used to detect the presence or absence of a particular marking. A pulse is output every time a predetermined marking is detected. Depending upon the number of such markings around the rim of the eddy disk, a predetermined number of pulses are generated by the pulse initiator to indicate one disk revolution. This information is then used to calculate the amount of electrical demand, i.e. power consumed, for display by a register.

As shown in U.S. Pat. No. 4,321,531 it is known to provide such a pulse initiator with means for determining the direction of rotation of the eddy disk. This is done through the use of a single light emitter and two light detectors arranged to image consecutive portions of the single patterned track formed about the rim of the eddy disk. The direction of rotation of the disk is determined by detecting the order in which the first and second light detector outputs change.

However, this arrangement suffers from the drawback that in order to eliminate ambiguity in the pattern of the outputs of the light detectors, and hence the determination of the direction of rotation of the eddy disk, a particular output of the pulse initiator is validated only after both detectors have seen the same state, that is both detectors must have consecutively seen either a light reflective or a light absorptive area before observing one of the code markings. In practice, this means that the code markings must be spaced sufficiently far apart from each other (e.g. 180°) so that the light detectors will simultaneously see long stretches of the reflective area of the eddy disk. This severely limits the amount of angular resolution with which the pulse initiator can determine the angular speed of rotation of the eddy disk. This drawback is especially evident where the disk moves very slowly or is in the process of changing direction.

This prior art pulse initiator arrangement also requires that the eddy disk be specially adapted for use as an optical encoder. However, it is often desired to retrofit such an optical encoding mechanism to an electricity meter which, heretofore, has required the costly and time consuming replacement of the eddy disk with an optically encoded version and addition of the associated light emitter and light detectors.

DISCLOSURE OF THE INVENTION

The present invention concerns an optical encoder which provides an unambiguous indication of the direction and speed of rotation of an optical shutter and associated shaft. The optical encoder comprises a rotatable optical shutter mounted to a shaft, the shutter bearing at least first and second radially concentric tracks having an identical pattern of alternating light transmissive and light blocking areas formed thereon. The light transmissive and light blocking areas of one track are angularly offset with respect to the light transmissive and light blocking areas of an adjacent track. Illuminating means, such as a pair of light emitters, are disposed on one side of the optical shutter and aligned with the first and second tracks for illuminating the optical shutter. At least first and second light detectors are disposed on a second side of the optical shutter and opposite the illuminating means. Means are also provided for detecting the frequency and pattern of outputs of the first and second light detectors in response to illumination passing through the tracks of the optical shutter. The pattern of outputs of the first and second light detectors are indicative of the direction of rotation of the optical shutter and the frequency of repetition of the pattern of outputs is indicative of the speed of rotation of the optical shutter.

Preferably, the optical shutter comprises a disk and the light transmissive and light blocking areas respectively comprise apertures and solid areas formed in the areas defined by the concentric tracks on the disk. The light emitters and light detectors may be arranged in pairs opposite each other and facing the concentric tracks of the optical shutter. Alternatively, the first emitter and first detector can be arranged adjacent each other on one side of the optical shutter with a second detector and a second light emitter, respectively, arranged on the opposite side of the optical shutter.

An important feature of the present invention is that by angularly offsetting the pattern of light transmissive and light blocking areas of the two concentric tracks, a unique pattern of outputs will be produced by the light detectors which depends upon the direction of rotation of the optical shutter. In particular, the light transmissive and light blocking areas may be arranged such that the first and second light detectors change state in accordance with a Gray Code.

A suitably programmed microprocessor can be used to detect the outputs of the light detectors and to determine therefrom the angular speed and direction of rotation of the optical shutter and its associated shaft. Further, if the detected pattern of outputs from the light detectors does not follow its expected or predetermined pattern then an alarm condition can be generated which is indicative of a possible failure of one or more of the light emitters or light detectors or possible tampering with the optical encoder.

The optical shutter may be further provided with a radial slot enabling the optical shutter to be readily mounted to a shaft, such as a shaft supporting the eddy disk in an electricity meter, without requiring disassembly of the meter.

BRIEF DESCRIPTION OF DRAWINGS

These and other features and advantages of the present invention will be readily apparent from the following description of the best mode of carrying out the invention and as shown in the accompanying drawings wherein:

FIG. 1 is a perspective view of an optical shaft encoder constructed in accordance with the principles of the present invention;

FIG. 2 is a plan view of one embodiment of an optical shutter for use in the present invention;

FIG. 3 is a more detailed view of one portion of the optical shutter taken along lines 3—3 of FIG. 2 showing the relationship of the light transmissive and light blocking areas to the outputs of the light detectors; and FIG. 4 is a schematic diagram of circuitry utilized in conjunction with the optical encoder of the present invention.

BEST MODE FOR CARRYING OUT THE INVENTION

FIG. 1 shows the principle components of an optical encoder constructed in accordance with the principles of the present invention. The optical encoder comprises an optical shutter 1 mounted to a shaft 3 for rotation therewith. As shown in FIG. 1 and in more detail in FIG. 2, optical shutter 1 includes a pair of radially concentric tracks 5 and 7 formed thereon. Each track comprises an identical series of light transmissive areas 9 and light blocking areas 11. For example, the light transmissive areas 9 may comprise slots or other openings formed in each of the tracks 5 and 7 while the light blocking areas 11 comprise the solid portions of the optical shutter disk.

The pattern of light transmissive and light blocking areas 9 and 11 on the inner track 5 is angularly offset from the pattern of light transmissive and light blocking areas formed on the outer track 7.

As shown in FIG. 1, a first light emitter E1 and a first light detector D1 are arranged adjacent each other on one side of optical shutter 1 and are respectively aligned with inner track 5 and outer track 7. A second light detector D2 and second light emitter E2 are arranged on the opposite side of optical shutter 1 from light emitter E1 and light detector D1, with light detector D2 being arranged opposite inner track 5 and light emitter E1, and light emitter E2 being arranged opposite outer track 7 and light detector D1.

As shown in FIG. 2, optical shutter 1 may further include a radial slot 13 extending from a central opening 15 of the optical shutter to its rim. The purpose of slot 13 is to enable optical shutter 1 to be mounted to shaft 3 without having to remove any additional components already attached to shaft 3. The actual mounting of optical shutter 1 to shaft is conventional, such as by means of a pair of C-shaped bushings or collars which fit over shaft 3 and between which optical shutter 1 is clamped.

In operation, as optical shutter 1 rotates, the alternating light transmissive and light blocking areas 9 and 11 of inner track 5 and outer track 7 cause the outputs of detectors D1 and D2, which are illuminated by respective light emitters E2 and E1, to change state in a unique pattern as shown in FIG. 3. Thus, when a portion of tracks 5 and 7 are aligned with the light emitters and light detectors at the position labelled A no light can reach either light detector and their output is each "0". When the light transmissive and light blocking areas of the two tracks are aligned with the light emitters and light detectors as in position B, the output of detector D1 will be "0" since light from light emitter E2 is blocked by area 11, while the output from light detector D2 will be "1" since light from light emitter E2 is transmitted through light transmissive area 9.

When optical shutter 1 is in position C with respect to the light emitters and light detectors the outputs of both detectors D1 and D2 will be a "1" indicating transmission of light from emitters E1 and E2 through light transmissive areas 9 to light detectors D2 and D1, respectively. Finally, when optical shutter 1 is arranged in position D with respect to the light emitters and light detectors the output of light detector D1 will be a "1" since light from light emitter E2 is transmitted through light transmissive area 9 to light detector D1, while the output of light detector D2 will be a "0" since light from light emitter E1 will be blocked by light blocking area 11 of inner track 5.

It will be appreciated that the foregoing pattern of detector outputs change state in a unique pattern as the optical shutter is rotated past the light emitters and light detectors. In particular, the outputs of the first and second light detectors change state in accordance with a Gray Code.

It will be further appreciated that the pattern of outputs of the light detectors is indicative of the direction of rotation of the optical shutter and its associated shaft. Thus, if optical shutter 1 moves clockwise, as shown in FIG. 3, the expected output pattern will be ABCD, etc. If optical shutter 1 were to rotate counterclockwise, the expected output pattern would be DCBA, etc. By simply detecting the pattern of outputs, e.g. ABCD or DCBA, an unambiguous indication of the direction of rotation of the optical shutter and its associated shaft is given. Furthermore, if neither of these two patterns is detected, i.e. if a pattern other than ABCD or DCBA is detected, an alarm condition can be generated which is indicative of a fault in one or more of the light emitters and/or light detectors or of possible tampering with the optical shutter, since under normal circumstances only the patterns ABCD or DCBA should be produced by the light detectors.

In FIG. 4 there is shown a simplified schematic of circuitry which can be used to detect the output of light detectors D1 and D2 and to determine the direction of rotation and angular speed of optical shutter 1. The circuitry comprises a microprocessor 17 of conventional design to which is connected a memory device 19, such as a random access memory (RAM). It is understood that RAM 19 need not be a separate component but may be comprised of memory already resident in microprocessor 17.

Microprocessor 17 is arranged to receive the outputs of light detectors D1 and D2. The microprocessor may also be arranged to provide energizing signals to illuminate light emitters E1 and E2 when continuous illumination of the light emitters is not desired. The microprocessor is suitably programmed in a conventional manner to detect the output states of detectors D1 and D2 (e.g. illuminated="high"="1" and unilluminated="low"="0"). The sequence of the changes of the output of detectors D1 and D2 may then be compared against the two different expected sequences, e.g. ABCD or DCBA, as discussed above. The detection of the appropriate sequence is indicative of the direction of rotation of the optical shutter.

In addition, microprocessor 17 may include an onboard or auxiliary clock which can be used to determine the angular speed of rotation of optical shutter 1. In particular, there are a number of predetermined repetitions of the light transmissive and light blocking areas forming the inner track 5 and outer track 7 on the optical shutter. In the case of the optical shutter shown in FIGS. 1 and 2 there are 12 such repetitions. Since the total number of pattern repetitions per one complete rotation of optical shutter 1 is known, by counting the number of such complete repetitions (e.g. ABCD or DCBA) over a predetermined time (e.g. one second) the angular speed of rotation of optical shutter 1 can be directly determined.

If neither pattern is detected, then an alarm condition may be generated indicative of a failure of one or more of the light emitters and/or light detectors or possible tampering with the optical shutter.

While the foregoing invention has been described in considerable detail, it will be appreciated that various alternatives and modifications would occur to those skilled in the art. For example, while the pairs of light emitters and light detectors E1,D1 and E2,D2 are shown adjacent to each other in FIG. 1, since such emitter/detector pairs are commonly available, the invention will operate equally well if both light emitters E1 and E2 are arranged on one side of optical shutter 1 and both light detectors D1 and D2 are arranged on the opposite side of the optical shutter. Further, it is possible to eliminate one of the light emitters so long as the remaining light emitter is positioned such that it can adequately illuminate both inner track 5 and outer track 7 and the two light detectors. The foregoing detailed description is thus illustrative, but not limitive of the invention which is defined by the appended claims.

I claim:

1. A direction sensitive optical encoder comprising:
    (a) a rotatable optical shutter, the shutter having first and second radially concentric tracks each of said tracks having a respective identical series of alternating light transmissive and light blocking areas formed thereon, the series of light transmissive and light blocking areas of one track being angularly offset with respect to the series of light transmissive and light blocking areas of the other track, there being a like number of light transmissive and light blocking areas on each of said tracks;
    (b) first illuminating means disposed on a first side of the optical shutter and aligned with the first track, for illuminating the area of the first concentric track;
    (c) second illuminating means disposed on a second side of the optical shutter and aligned with the second track, for illuminating the area of the second concentric track;
    (d) first light detector means disposed on the second side of the optical shutter opposite said first illuminating means and aligned with said first concentric track;
    (e) second light detector means disposed on the first side of the optical shutter opposite said second illuminating means and aligned with said second concentric track;
    (f) means for detecting the frequency and pattern of outputs of said first and second light detector means in response solely to illumination passing through the light transmissive areas of the tracks of the optical shutter from said first and second illuminating means, said light transmissive and light blocking areas of said concentric tracks being arranged in a disposition such that the outputs of the first and second light detector means change state in a unique pattern as the optical shutter is rotated past said illuminating means and said light detector means;
    (g) means for detecting whether the detected pattern of outputs of the light detectors follows a predetermined order; and
    (h) means for generating an alarm condition if said predetermined order is not detected, wherein the pattern of outputs of the first and second light detector means is indicative of the direction of rotation of the optical shutter, and the frequency of repetition of said predetermined pattern of outputs is indicative of the speed of rotation of the optical shutter.

2. The optical encoder of claim 1 wherein the optical shutter is a disk.

3. The optical encoder of claim 1 wherein the optical shutter is mounted to a shaft for rotation therewith.

4. The optical encoder of claim 1 wherein the pattern of light transmissive and light blocking areas are arranged such that the outputs of the first and second light detectors change state in accordance with a Gray Code.

* * * * *